United States Patent
Hsieh et al.

(10) Patent No.: US 9,704,792 B2
(45) Date of Patent: Jul. 11, 2017

(54) SEMICONDUCTOR PACKAGE ASSEMBLY

(71) Applicant: MediaTek Inc., Hsin-Chu (TW)

(72) Inventors: Tung-Hsien Hsieh, Zhubei (TW);
Che-Ya Chou, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 9 days.

(21) Appl. No.: 15/048,807

(22) Filed: Feb. 19, 2016

(65) Prior Publication Data

US 2016/0260659 A1   Sep. 8, 2016

Related U.S. Application Data

(60) Provisional application No. 62/127,901, filed on Mar. 4, 2015.

(51) Int. Cl.
| | |
|---|---|
| *H01L 23/31* | (2006.01) |
| *H01L 23/498* | (2006.01) |
| *H01L 23/00* | (2006.01) |
| *H01L 25/10* | (2006.01) |

(52) U.S. Cl.
CPC .... *H01L 23/49822* (2013.01); *H01L 23/3128* (2013.01); *H01L 23/49811* (2013.01); *H01L 24/16* (2013.01); *H01L 25/105* (2013.01); *H01L 2224/0401* (2013.01); *H01L 2224/16227* (2013.01); *H01L 2225/1023* (2013.01); *H01L 2225/1058* (2013.01); *H01L 2225/1088* (2013.01); *H01L 2924/1431* (2013.01); *H01L 2924/1432* (2013.01); *H01L 2924/1436* (2013.01); *H01L 2924/15331* (2013.01)

(58) Field of Classification Search
CPC ................. H01L 23/49822; H01L 23/3128
See application file for complete search history.

(56) References Cited

U.S. PATENT DOCUMENTS

| | | | |
|---|---|---|---|
| 2008/0017968 A1 | 1/2008 | Choi et al. | |
| 2010/0000775 A1* | 1/2010 | Shen ................. | H01L 23/3128 174/260 |
| 2011/0100696 A1 | 5/2011 | Nagamatsu et al. | |
| 2011/0174527 A1 | 7/2011 | Nagamatsu et al. | |

FOREIGN PATENT DOCUMENTS

| | | |
|---|---|---|
| EP | 2 482 623 | 8/2012 |
| WO | WO 2011/052746 | 5/2011 |
| WO | WO 2016/018950 | 2/2016 |

* cited by examiner

*Primary Examiner* — Fernando L Toledo
*Assistant Examiner* — Valerie N Newton
(74) *Attorney, Agent, or Firm* — McClure, Qualey & Rodack, LLP

(57) ABSTRACT

The invention provides a semiconductor package assembly. The semiconductor package assembly includes a redistribution layer (RDL) structure die-attach surface and a bump-attach surface opposite the die-attach surface. A semiconductor die is mounted on the die-attach surface of the redistribution layer (RDL) structure. A first solder mask layer is disposed on the die-attach surface. The first solder mask layer surrounds the semiconductor die. An additional circuit structure is disposed on a portion of the first solder mask, surrounding the semiconductor die. The additional circuit structure includes a pad portion having a first width and a via portion has a second width that is less than the first width. The via portion passes through the first solder mask layer to be coupled the redistribution layer (RDL) structure.

20 Claims, 3 Drawing Sheets

SEMICONDUCTOR PACKAGE ASSEMBLY

CROSS REFERENCE TO RELATED APPLICATIONS

This application claims the benefit of U.S. Provisional Application No. 62/127,901 filed Mar. 4, 2015, the entirety of which is incorporated by reference herein.

BACKGROUND OF THE INVENTION

Field of the Invention

The present invention relates to a semiconductor package assembly, and in particular to a semiconductor package assembly with an enlarged bonding area of the die attachment.

Description of the Related Art

In order to ensure miniaturization and multi-functionality of electronic products and communication devices, it is desired that semiconductor packages be small in size, to support multi-pin connection, high speeds, and high functionality. A multi-functional semiconductor package usually requires that the semiconductor die have a larger size. However, in a conventional semiconductor package, it is hard to provide additional area for the semiconductor die with a large die size mounted thereon.

Thus, a novel semiconductor package assembly is desirable.

BRIEF SUMMARY OF THE INVENTION

A semiconductor package assembly is provided. An exemplary embodiment of a semiconductor package assembly includes a redistribution layer (RDL) structure die-attach surface and a bump-attach surface opposite the die-attach surface. A semiconductor die is mounted on the die-attach surface of the redistribution layer (RDL) structure. A first solder mask layer is disposed on the die-attach surface. The first solder mask layer surrounds the semiconductor die. An additional circuit structure is disposed on a portion of the first solder mask, surrounding the semiconductor die. The additional circuit structure comprises a pad portion having a first width and a via portion having a second width that is less than the first width. The via portion passes through the first solder mask layer to be coupled the redistribution layer (RDL) structure.

Another exemplary embodiment of a semiconductor package assembly includes a redistribution layer (RDL) structure die-attach surface and a bump-attach surface opposite the die-attach surface. A semiconductor die is mounted on the die-attach surface of the redistribution layer (RDL) structure. A first solder mask layer is disposed on the die-attach surface. The first solder mask layer surrounds the semiconductor die. A second solder mask layer is disposed on the bump-attach surface. A first conductive bump is disposed over the first solder mask layer and coupled to a first pad of the redistribution layer (RDL) structure through a T-shaped conductive structure passing through the first solder mask layer. A second conductive bump passes through the second solder mask layer and coupled to a second pad the redistribution layer (RDL) structure.

Yet another exemplary embodiment of a semiconductor package assembly includes a redistribution layer (RDL) structure die-attach surface and a bump-attach surface opposite the die-attach surface. A semiconductor die is mounted on the die-attach surface of the redistribution layer (RDL) structure. A first solder mask layer is disposed on the die-attach surface, surrounding the semiconductor die. A first conductive bump is disposed over the first solder mask and coupled to a first pad of the redistribution layer (RDL) structure through a single circuit structure on a portion the first solder mask layer. A first distance between a center of the first pad and a sidewall of the semiconductor die, which is close to the first pad, is equal to or greater than a second distance between a center of the first conductive bump and the sidewall of the semiconductor die.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
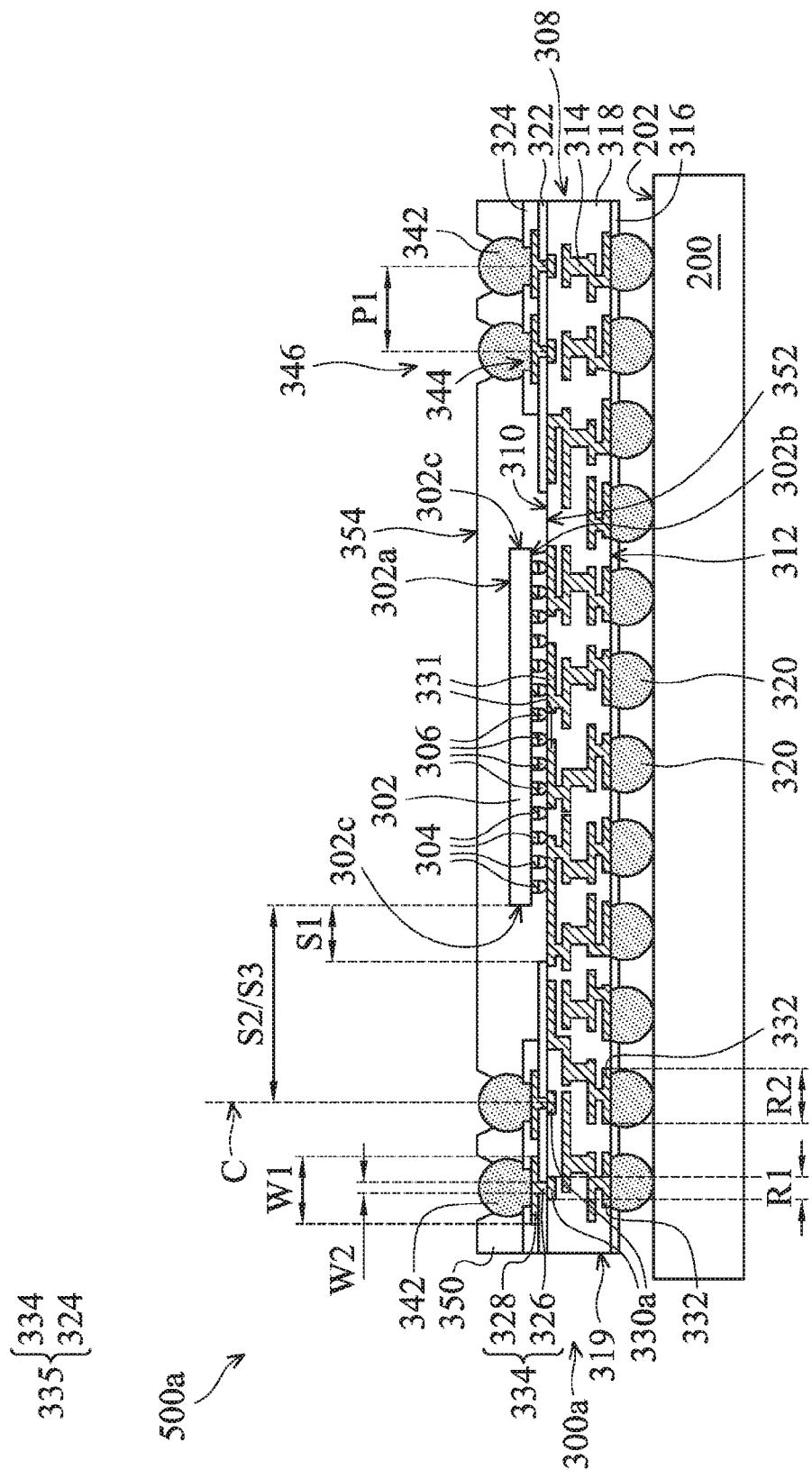
FIGS. 1-3 are cross-sectional views of a semiconductor package assembly in accordance with some embodiments of the disclosure.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and are not drawn to scale. The dimensions and the relative dimensions do not correspond to actual dimensions in the practice of the invention.

FIG. 1 is a cross-sectional view of a semiconductor package assembly including a semiconductor package in accordance with some embodiments of the disclosure. In some embodiments, the semiconductor package assembly 500a is a wafer-level semiconductor package assembly, for example, a flip-chip semiconductor package assembly.

As shown in FIG. 1, the semiconductor package assembly 500a includes at least one wafer-level semiconductor package mounted on a base 200. In this embodiment, the wafer-level semiconductor package includes a semiconductor package 300a. The semiconductor package 300a may include a system-on-chip (SOC) package 300a.

As shown in FIG. 1, the base 200, for example a printed circuit board (PCB), may be formed of polypropylene (PP). It should also be noted that the base 200 can be a single layer or a multilayer structure. A plurality of pads (not shown) and/or conductive traces (not shown) is disposed on a die-attach surface 202 of the base 200. In one embodiment, the conductive traces may comprise power segments, signal trace segments or ground trace segments, which are used for the input/output (I/O) connections of the semiconductor package 300a. Also, the semiconductor package 300a is mounted directly on the conductive traces. In some other embodiments, the pads are disposed on the die-attach surface 202, connected to different terminals of the conductive traces. The pads are used for the semiconductor package 300a mounted directly thereon.

As shown in FIG. 1, the semiconductor package 300a is mounted on the die-attach surface 202 of the base 200 by a bonding process. The semiconductor package 300a is mounted on the base 200 through the conductive structures 320. The semiconductor package 300a includes a semiconductor die 302 and a redistribution layer (RDL) structure 308. The semiconductor die 302, for example, may include a logic die including a central processing unit (CPU), a graphics processing unit (GPU), a dynamic random access memory (DRAM) controller or any combination thereof.

As shown in FIG. 1, the semiconductor die 302 is fabricated by flip-chip technology. Pads 304 of the semiconductor die 302 are disposed on a front surface 302b to be electrically connected to the circuitry (not shown) of the semiconductor die 302. In some embodiments, the pads 304 belong to the uppermost metal layer of the interconnection structure (not shown) of the semiconductor die 302. The pads 304 of the semiconductor die 302 are in contact with the corresponding conductive structures 306, for example, conductive bumps. It should be noted that the number of semiconductor dies 302 integrated in the semiconductor package assembly 500a is not limited to that disclosed in the embodiment.

As shown in FIG. 1, the semiconductor package 300a further includes the redistribution layer (RDL) structure 308 disposed over the front surface 302b of the semiconductor die 302. The RDL structure has a die-attach surface 310 and a bump-attach surface 312 opposite the die-attach surface 310. The semiconductor die 302 of the semiconductor package 300a is mounted on and connected to the die-attach surface 310 of the RDL structure 308 through conductive structures 306, for example, conductive bumps or solder pastes. In some embodiments, the RDL structure 308 may have one or more conductive traces 314 disposed in one or more inter-metal dielectric (IMD) layers 318. Also, the RDL structure 308 may comprise pads 330a and 331, which are disposed close to the die-attach surface 310, and pads 332, which are disposed close to the bump-attach surface 312. However, it should be noted that the number of conductive traces 314, the number of IMD layers 318, the number of pads 330a, 331 and the number of pads 332 shown in FIG. 1 are only an example and are not a limitation to the present invention.

In some embodiments as shown in FIG. 1, the pads 330a are provided for an additional memory package, for example, a dynamic random access memory (DRAM) package (not shown), mounted thereon. Therefore, the pads 330a are designed to be positioned in a peripheral portion of the die-attach surface 310, which surrounds the semiconductor die 302. Also, the pads 330a are not in direct contact with the conductive structures 306 positioned in a center portion of the die-attach surface 310, which is provided for the semiconductor die 302 mounted thereon. In some embodiments, the pads 330a may serves as DRAM package-attach pad. The pads 331 are provided for the semiconductor die 302 mounted thereon. Therefore, the pads 331 are designed to be positioned in the center portion of the die-attach surface 310. In some embodiments, the pads 331 may serve as semiconductor die-attach pad. Additionally, the pads 332 are designed to be positioned both in a peripheral portion and a center portion of the bump-attach surface 312. In some embodiments, the width (diameter) R1 of the pads 330a is designed to be less than the width (diameter) R2 of the pads 332.

As shown in FIG. 1, the semiconductor package 300a further includes a first solder mask layer 322 disposed on the die-attach surface 310 and a second solder mask layer 316 disposed on the bump-attach surface 312 of the RDL structure 308. In some embodiments, the first solder mask layer 322 is in contact with the peripheral portion of the die-attach surface 310, which surrounds the semiconductor die 302. In other words, the first solder mask layer 322 is formed surrounds the semiconductor die 302 and separated from the semiconductor die 302 by a distance S1. The second solder mask layer 316 is designed to be positioned both in a peripheral portion and a center portion of the bump-attach surface 312. The first solder mask layer 322 has openings (not shown) corresponding to the pads 330a, which are disposed close to the die-attach surface 310. The second solder mask layer 316 has openings (not shown) corresponding to the pads 332, which are disposed close to the bump-attach surface 312. Therefore, the pads 330a and the pads 332 are exposed form the openings of the first solder mask layer 322 and the second solder mask layer 316, respectively. In some embodiments, the first solder mask layer 322 and the second solder mask layer 316 are formed of solder mask materials.

In some embodiments as shown in FIG. 1, the semiconductor package 300a further includes an additional circuit structure 335 disposed on a portion of the first solder mask 322. In some embodiments, the additional circuit structure 335 is provided for an additional memory package, for example, a dynamic random access memory (DRAM) package (not shown), mounted thereon. Therefore, the additional circuit structure 335 is designed to be positioned in the peripheral portion of the die-attach surface 310 and corresponding to the pads 330a (i.e. the DRAM package-attached pads). In some embodiments, the additional circuit structure 335 includes at least one T-shaped conductive structure 334 and an insulating layer 324 on the T-shaped conductive structure 334. The T-shaped conductive structure 334 includes a pad portion 328 and a via portion 326 in contact with the pad portion 328. The pad portion 328 having a width W1 is disposed between the insulating layer 324 and the first solder mask layer 322. The via portion 326, which has a width W2 less than the width W1, is disposed between the pad portion 328 and the pads 330a of the RDL structure 308. Also, the via portion 326 is formed passing through the first solder mask layer 322 and in contact with the one or more corresponding pads 330a of the RDL structure 308. In some embodiments, the width (diameter) R1 of the pads 330a is designed to be less than the width W1 of the pad portion 328 and greater than the width W2 of the via portion 326. The additional circuit structure 335 has a simple composition, so that the package height of the semiconductor package 300a can be maintained.

In some embodiments as shown in FIG. 1, the pad 330a and the via portion 326 of the T-shaped conductive structure 334 are concentrically disposed about an axis C of rotation. The via portion 326 and the pad portion 328 of the T-shaped conductive structure 334 are concentrically disposed about the axis C of rotation. Therefore, the distance S2 between a center of the via portion 326 and a sidewall 302c of the semiconductor die 302, which is close to the via portion 326, is equal to the distance S3 between a center of pad portion 328 and the sidewall 302c of the semiconductor die 302. Similarly, the distance (equal to S2) between a center of the pad 330a and a sidewall 302c of the semiconductor die 302, which is close to the pad 330a, is equal to the distance S3 between the center of pad portion 328 and the sidewall 302c of the semiconductor die 302.

As shown in FIG. 1, the insulating layer 324 of the additional circuit structure 334 is in contact with the pad portion. Also, the insulating layer 324 is disposed surrounding the semiconductor die 302 and separated from the semiconductor die 302 by a distance greater than the distance S1. Also, the insulating layer 324 has at least one first opening 344 to expose a portion of the corresponding pad portion 328 of the T-shaped conductive structure 334. In some embodiments, the insulating layer is formed of a solder mask material or polypropylene (PP).

As shown in FIG. 1, the semiconductor package 300a further includes a molding compound 350 covering and surrounding the semiconductor die 302. The molding compound 350 is in contact with the semiconductor die 302. The molded compound 350 has opposite surfaces 352 and 354 respectively close to the front surface 302b and back surface 302a of the semiconductor die 302. The surface 352 of the molding compound 350 may be in contact with the surface 310 of the RDL structure 308. The molding compound 350 may also cover the back surface 302a of the semiconductor die 302. In some embodiments, the molding compound has at least one second opening 346 passing therethrough. The second opening 346 is formed aligned and connected to the corresponding first opening 344 of the insulating layer 324. In some embodiments, the molding compound 350 may be formed of a nonconductive material, such as an epoxy, a resin, a moldable polymer, or the like. The molding compound 350 may be applied while substantially liquid, and then may be cured through a chemical reaction, such as in an epoxy or resin. In some other embodiments, the molding compound 350 may be an ultraviolet (UV) or thermally cured polymer applied as a gel or malleable solid capable of being disposed around the semiconductor die 302, and then may be cured through a UV or thermal curing process. The molding compound 350 may be cured with a mold (not shown).

As shown in FIG. 1, the semiconductor package 300a further includes at least one first conductive bump 342 disposed on the die-attach surface 310 of the RDL structure 308, which is close to the semiconductor die 302. The conductive bump 342 is disposed in the first opening 344 of the insulating layer 324 and the second opening 346 of the molding compound 350. Also, the first conductive bump 342 is in contact with the corresponding pad portion 328 of the T-shaped conductive structure 334. Further, the first conductive bump 342 is in contact with the insulating layer 324 and the molding compound 350. In some embodiment, the conductive bump 342 is provides for an additional memory package, for example, a dynamic random access memory (DRAM) package (not shown), stacked thereon. Therefore, the conductive bump 342 may serve as a DRAM package bump.

In some embodiments as shown in FIG. 1, the pad 330a, the pad portion 328 of the T-shaped conductive structure 334 and the corresponding first conductive bump 342 are concentrically disposed about an axis C of rotation. Therefore, the distance (equal to S2) between the center of the pad 330a and the sidewall 302c of the semiconductor die 302, which is close to the pad 330a, is equal to than the distance (equal to S3) between a center of the corresponding first conductive bump 342 and the sidewall 302c of the semiconductor die 302. Also, both the pad 330a and the via portion 326 fully overlap the first conductive bump 342 in some embodiments as shown in FIG. 1.

As shown in FIG. 1, the semiconductor package 300a further includes second conductive structures 320 disposed on the bump-attach surface 312 of the RDL structure 308, which is away from the semiconductor die 302. The second conductive structures 320 are coupled to and in contact with the pads 332, which are disposed close to the bump-attach surface 312, through the exposed to openings of the second solder mask layer 316. Also, the second conductive structures 320 are separated from the molding compound 350 through the RDL structure 308. In other words, the second conductive structures 320 are free from contact with the molding compound 350. In some embodiments, the second conductive structures 320 may comprise a conductive bump structure such as a copper bump or a solder bump structure, a conductive pillar structure, a conductive wire structure, or a conductive paste structure.

Figure 2:
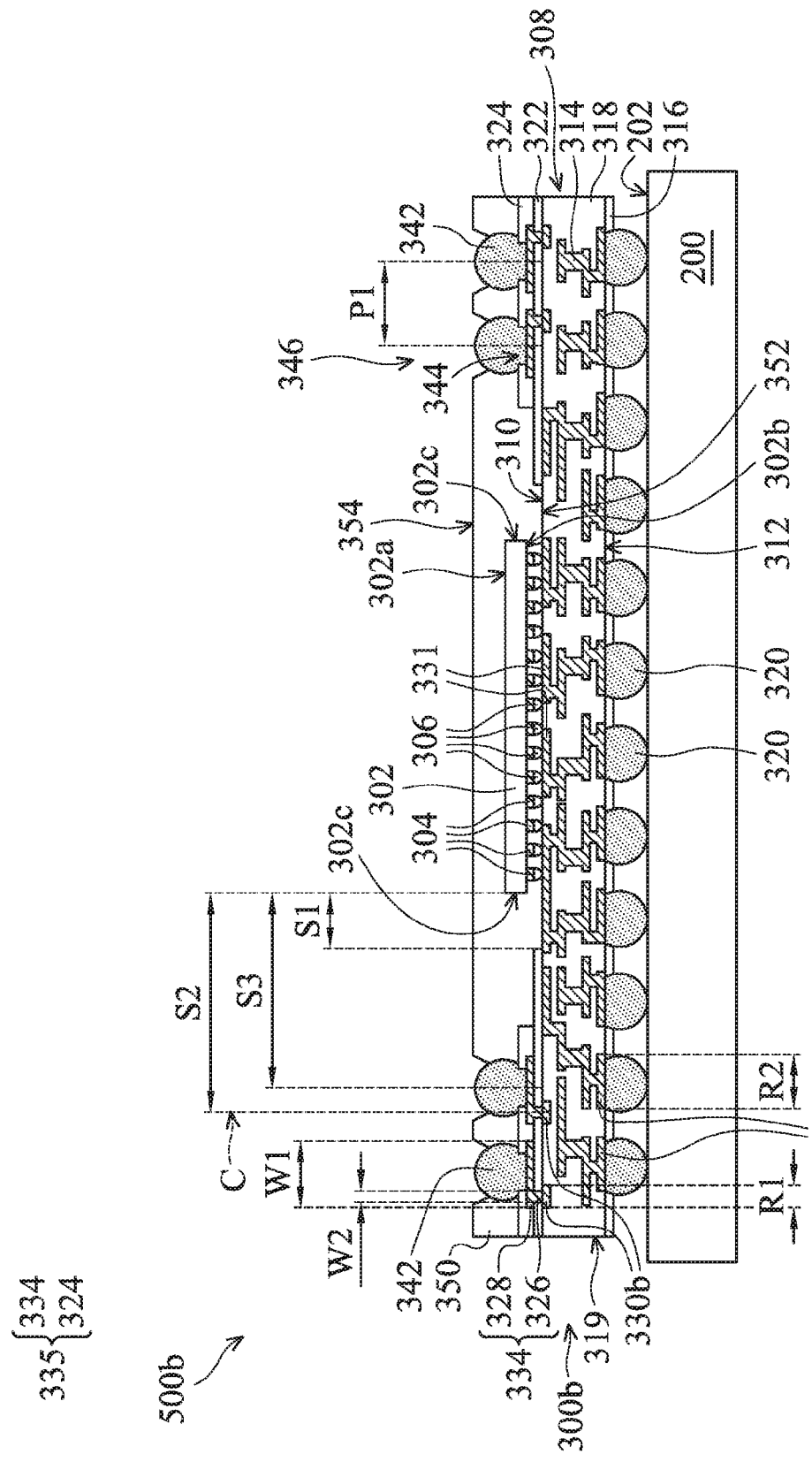

FIG. 2 is a cross-sectional view of a semiconductor package assembly including a semiconductor package in accordance with some embodiments of the disclosure. Descriptions of elements of the embodiments hereinafter that are the same or similar as those previously described with reference to FIG. 1 are omitted for brevity. Because the pad portion 328 of the T-shaped conductive structure 334, which is provided for the corresponding first conductive bump 342 directly attached thereto, is positioned above the die-attach surface 310 of the RDL structure 308, the pad portion 328 has the redistribution (redirect) function for a first pad 330b. The design flexibly of a first pad 330b of the RDL structure 308 is improved.

As shown in FIG. 2, one of the differences between the semiconductor package assembly 500a shown in FIG. 1 and the semiconductor package assembly 500b is that both the first pad 330b of the RDL structure 308 and the via portion 326 of the T-shaped conductive structure 334 can be designed to be positioned closer to an edge 319 of the semiconductor package 300b while the pad portion 328 and the corresponding first conductive bump 342 keeps a fixed distance (i.e. the distance S3) separate from the sidewall 302c of the semiconductor die 302. The first conductive bumps 342 of the semiconductor package 300b as shown in FIG. 2 may also maintain the fixed pitch P1, which is the same as the pitch P1 of first conductive bumps 342 of the semiconductor package 300a as shown in FIG. 2. Further, the pad portion 328 of the T-shaped conductive structure 334 may keep the width W1, which is the same as the width W1 of the pad portion 328 of the semiconductor package 300a shown in FIG. 1.

In this embodiment, the via portion 326 and the pad portion 328 of the T-shaped conductive structure 334 are not concentrically disposed about the axis C of rotation. However, the first pad 330b and the via portion 326 of the T-shaped conductive structure 334 of the semiconductor package 300b of the semiconductor package assembly 500b are concentrically disposed about the axis C of rotation. Therefore, the distance S2 between the center of the via portion 326 and the sidewall 302c of the semiconductor die 302, which is close to the via portion 326, is greater than the distance S3 between the center of pad portion 328 and the sidewall 302c of the semiconductor die 302. Similarly, the distance (i.e. the distance S2) between the center of the first pad 330b and a sidewall 302c of the semiconductor die 302, which is close to the first pad 330b, is greater than the distance S3 between the center of pad portion 328 and the sidewall 302c of the semiconductor die 302.

In some embodiments as shown in FIG. 2, the pad portion 328 of the T-shaped conductive structure 334 and the corresponding first conductive bump 342 are concentrically disposed about the axis C of rotation. Therefore, the distance (i.e. the distance S2) between a center of the first pad 330b and the sidewall 302c of the semiconductor die 302, which is close to the first pad 330b is greater than the distance (i.e. the distance S3) between a center of the corresponding first conductive bump 342 and the sidewall 302c of the semiconductor die 302. Also, both the first pad 330b and the via portion 326 partially overlap the first conductive bump 342 in some embodiments as shown in FIG. 2.

Figure 3:
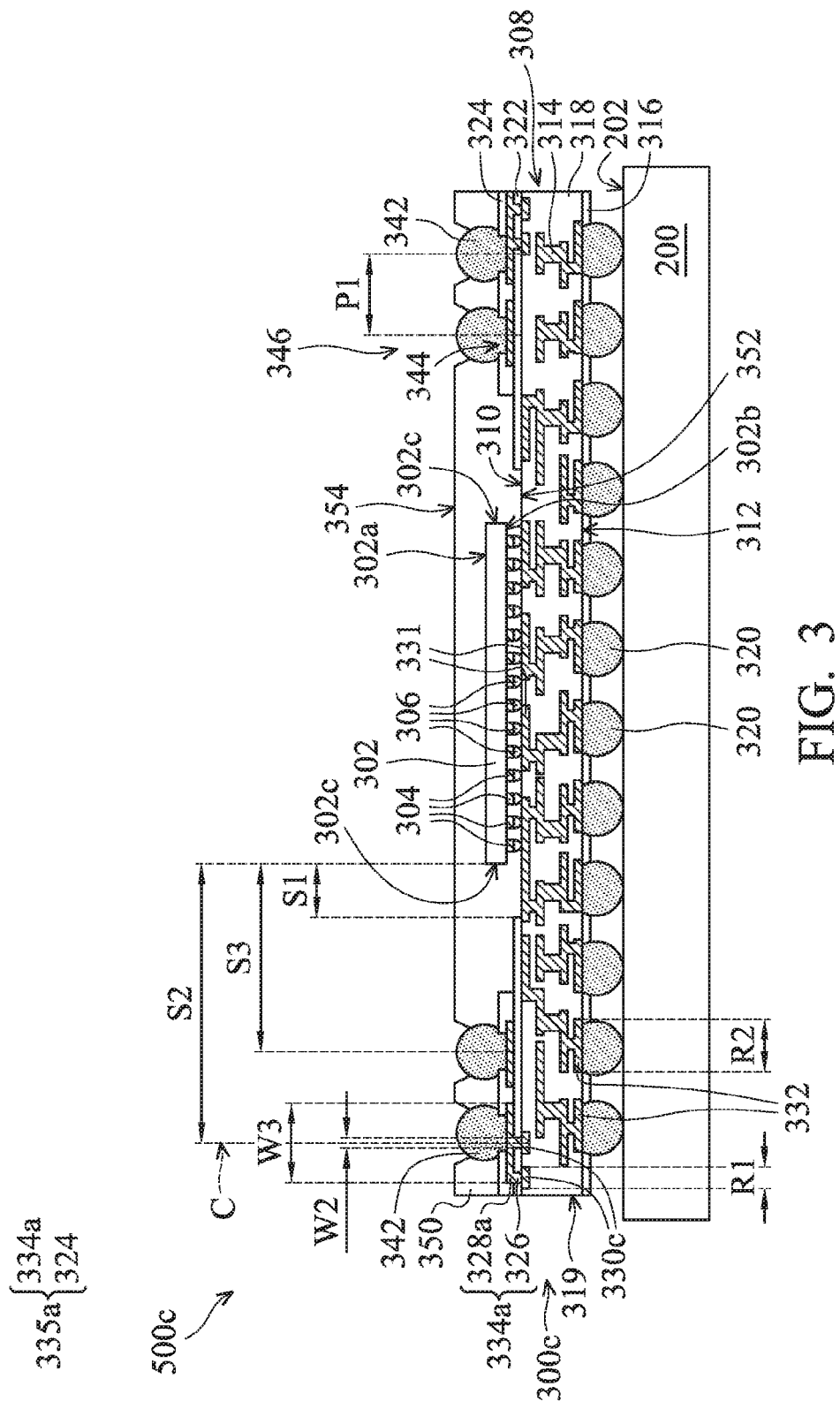

FIG. 3 is a cross-sectional view of a semiconductor package assembly including a semiconductor package in accordance with some embodiments of the disclosure. Descriptions of elements of the embodiments hereinafter that are the same or similar as those previously described with reference to FIGS. 1-2 are omitted for brevity. In this embodiment, both a first pad 330c of the RDL structure 308 and the via portion 326 of a T-shaped conductive structure 334a can be designed to be positioned closer to an edge 319 of the semiconductor package 300c while the pad portion 328 and the corresponding first conductive bump 342 keeps a fixed distance (i.e. the distance S3) separate from the sidewall 302c of the semiconductor die 302. The first conductive bumps 342 of the semiconductor package 300c as shown in FIG. 3 may also maintain the fixed pitch P1, which is the same as the pitch P1 of first conductive bumps 342 of the semiconductor packages 300a and 300b as shown in FIGS. 1-2.

As shown in FIG. 3, one of the differences between the semiconductor package assembly 500b shown in FIG. 2 and the semiconductor package assembly 500c is that a semiconductor package 300c of the semiconductor package assembly 500c further includes an additional circuit structure 335a. The additional circuit structure 335a includes at least one T-shaped conductive structure 334a and a single insulating layer 324 on the T-shaped conductive structure 334a. The T-shaped conductive structure 334a includes a pad portion 328a and a via portion 326 in contact with the pad portion 328. The width W3 of the pad portion 328a is designed to be greater than the W1 of the pad portion 328 as shown in FIGS. 1 and 2. The pad portion 328a with a greater width has the redistribution (redirect) function to provide for the design flexibly of positions of one or more first pads 330c. Therefore, both the first pad 330c and the via portion 326 can be designed to be positioned as close as the edge 319 of the semiconductor package 300c.

As shown in FIG. 3, the via portion 326 and the pad portion 328 of the T-shaped conductive structure 334 are not concentrically disposed about the axis C of rotation. However, the first pad 330c and the via portion 326 of the T-shaped conductive structure 334 of the semiconductor package 300c of the semiconductor package assembly 500c are concentrically disposed about the axis C of rotation. The pad portion 328 of the T-shaped conductive structure 334 and the corresponding first conductive bump 342 are concentrically disposed about the axis C of rotation. In this embodiment, the first pad 330c does not overlap and the corresponding first conductive bump 342.

In this embodiment as shown in FIG. 3, the distance S2 between the center of the via portion 326 and the sidewall 302c of the semiconductor die 302, which is close to the via portion is much greater than the distance S3 between the center of pad portion 328 and the sidewall 302c of the semiconductor die 302. Similarly, the distance (equal to S2) between the center of the first pad 330c and the sidewall 302c of the semiconductor die 302, which is close to the first pad 330c, is greater than the distance S3 between the center of pad portion 328 and the sidewall 302c of the semiconductor die 302.

In this embodiment as shown in FIG. 3, the distance (equal to S2) between the center of the first pad 330c and the sidewall 302c of the semiconductor die 302, which is close to the first pad 330c, is greater than the distance (equal to S3) between the center of the corresponding first conductive bump 342 and the sidewall 302c of the semiconductor die 302. Also, both the first pad 330c and the via portion 326 can be designed to be positioned as close as the edge 319 of the semiconductor package 300c and not overlapping the first conductive bump 342 in some embodiments as shown in FIG. 3. Further, two or more first pads 330c and the via portions 326 can be designed to be coupled to a single corresponding pad portion 328 and a single corresponding first conductive bump 342.

The semiconductor package assembly in accordance with some embodiments of the disclosure has the following advantages. The semiconductor package assembly includes an additional circuit structure disposed on a portion of the solder mask on the die-attach surface of the redistribution layer (RDL) structure, which is provided for the semiconductor die mounted thereon. The additional circuit structure is provided for an additional dynamic random access memory (DRAM) package mounted thereon. In some embodiments, the additional circuit structure surrounds the semiconductor die but not positioned between the semiconductor die and the RDL structure. The additional circuit structure includes at least one T-shaped conductive structure passing through the solder mask layer and a single insulating layer on the T-shaped conductive structure. The thin thickness of the additional circuit structure may facilitate maintaining the package height. Because the pad portion of the T-shaped conductive structure, which is provided for the corresponding conductive bump directly attached thereto, is positioned above the die-attach surface of the RDL structure, the pad portion has the redistribution (redirect) function for the DRAM package-attach pads of the RDL structure. The design flexibly of the DRAM package-attach pads of the RDL structure is improved. In some embodiments, the DRAM package-attach pad, the via portion and pad portion of the corresponding T-shaped conductive structure, and the corresponding conductive bump are concentrically disposed about an axis of rotation. The distance between the center of the DRAM package-attach pad and the sidewall of the semiconductor die, which is close to the DRAM package-attach pad, is equal to the distance between the center of pad portion and the sidewall of the semiconductor die.

Alternatively, both the first pad of the RDL structure and the via portion of the T-shaped conductive structure can be designed to be positioned closer to the outer edge of the semiconductor package while the pad portion and the corresponding first conductive bump keeps a fixed distance separate from the sidewall of the semiconductor die. For example, the DRAM package-attach pad and the pad portion of the T-shaped conductive structure are not concentrically disposed about the same axis of rotation. Alternatively, the pad portion is designed to have a greater width to provide the redistribution (redirect) function for the design flexibly of positions of one or more DRAM package-attach pads. Therefore, both the DRAM package-attach pad and the via portion can be designed to be positioned as close as the edge of the semiconductor package. The distance between the center of the DRAM package-attach pad and the sidewall of the semiconductor die, which is close to the DRAM package-attach pad, is greater than the distance between the center of pad portion and the sidewall of the semiconductor die. The bonding area of the die-attach surface of the RDL structure can be increased. Therefore, the size (the width or length) of the semiconductor die can be further enlarged while the corresponding first conductive bump maintains a fixed bump pitch for the dynamic random access memory (DRAM) die mounted thereon. Because the re-arrangement of the DRAM package-attach pads may increase the routing space of the RDL structure, the additional passive devices, for example, decoupling capacitors, can be designed to be embedded in the RDL structure.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor package assembly, comprising:
a redistribution layer (RDL) structure die-attach surface and a bump-attach surface opposite the die-attach surface;
a semiconductor die mounted on the die-attach surface of the redistribution layer (RDL) structure;
a first solder mask layer disposed on the die-attach surface, surrounding the semiconductor die; and
an additional circuit structure on a portion of the first solder mask, surrounding the semiconductor die, wherein the additional circuit structure comprises:
a pad portion having a first width;
an insulating layer on the pad portion, wherein the insulating layer has an first opening to expose the pad portion;
a molding compound covering the semiconductor die, wherein the molding compound has a second opening aligned to the first opening of the insulating layer;
a first conductive bump disposed in the first opening and the second opening, in contact with the pad portion; and
a via portion having a second width that is less than the first width, wherein the via portion passes through the first solder mask layer and is coupled the redistribution layer (RDL) structure.

2. The semiconductor package assembly as claimed in claim 1, further comprising:
a second solder mask disposed on the bump-attach surface;
a second conductive bump disposed on and passing through the second solder mask, wherein the second conductive bump is in contact with a second pad of the redistribution layer (RDL) structure, which is close to the bump-attach surface.

3. The semiconductor package assembly as claimed in claim 2, wherein the second pad has a fourth width greater than the third width.

4. The semiconductor package assembly as claimed in claim 1, wherein the via portion is in contact with a first pad of the redistribution layer (RDL) structure, which is close to the die-attach surface.

5. The semiconductor package assembly as claimed in claim 4, wherein the first pad has a third width that is less than the first width and greater than the second width.

6. The semiconductor package assembly as claimed in claim 1, wherein a first distance between a center of the via portion and a sidewall of the semiconductor die, which is close to the via portion is equal to or greater than a second distance between a center of pad portion and the sidewall of the semiconductor die.

7. The semiconductor package assembly as claimed in claim 1, wherein the insulating layer is formed of a solder mask material or polypropylene (PP).

8. The semiconductor package assembly as claimed in claim 1, wherein a third distance between a center of the first pad and a sidewall of the semiconductor die, which is close to the first pad is equal to or greater than a fourth distance between a center of the first conductive bump and the sidewall of the semiconductor die.

9. A semiconductor package assembly, comprising:
a redistribution layer (RDL) structure die-attach surface and a bump-attach surface opposite the die-attach surface;
a semiconductor die mounted on the die-attach surface of the redistribution layer (RDL) structure;
a first solder mask layer disposed on the die-attach surface, surrounding the semiconductor die;
a second solder mask layer disposed on the bump-attach surface;
a first conductive bump disposed over the first solder mask layer, coupled to a first pad of the redistribution layer (RDL) structure through a T-shaped conductive structure passing through the first solder mask layer;
a molding compound covering the semiconductor die; and
a second conductive bump passing through the second solder mask layer and coupled to a second pad the redistribution layer (RDL) structure;
wherein:
the T-shaped conductive structure comprises a pad portion having a first width, and a single insulating layer on the pad portion;
the insulating layer has an first opening to expose the pad portion;
the molding compound has a second opening aligned to the first opening of the insulating layer; and
the first conductive bump is disposed in the first opening and the second opening, in contact with the pad portion.

10. The semiconductor package assembly as claimed in claim 9, wherein the T-shaped conductive structure further comprises:
a via portion having a second width that is less than the first width, wherein the via portion passes through the first solder mask layer and in contact with the first pad, which is close to the die-attach surface.

11. The semiconductor package assembly as claimed in claim 10, wherein the first pad has a third width that is less than the first width and greater than the second width.

12. The semiconductor package assembly as claimed in claim 11, wherein the second pad has a fourth width greater than the third width.

13. The semiconductor package assembly as claimed in claim 10, wherein a first distance between a center of the via portion and a sidewall of the semiconductor die, which is close to the via portion is equal to or greater than a second distance between a center of the pad portion and the sidewall of the semiconductor die.

14. The semiconductor package assembly as claimed in claim 10, wherein a third distance between a center of the first pad and a sidewall of the semiconductor die, which is close to the first pad is equal to or greater than a fourth distance between a center of the first conductive bump and the sidewall of the semiconductor die.

15. The semiconductor package assembly as claimed in claim 9, wherein the insulating layer is formed of a solder mask material or polypropylene (PP).

16. A semiconductor package assembly, comprising:
a redistribution layer (RDL) structure die-attach surface and a bump-attach surface opposite the die-attach surface;

a semiconductor die mounted on the die-attach surface of the redistribution layer (RDL) structure;

a first solder mask layer disposed on the die-attach surface, surrounding the semiconductor die;

a molding compound covering the semiconductor die; and a first conductive bump disposed over the first solder mask, coupled to a first pad of the redistribution layer (RDL) structure through a single circuit structure on a portion the first solder mask layer, wherein a first distance between a center of the first pad and a sidewall of the semiconductor die, which is close to the first pad, is equal to or greater than a second distance between a center of the first conductive bump and the sidewall of the semiconductor die;

wherein:

the single circuit structure comprises a pad portion having a first width and an insulating layer on the pad portion;

the insulating layer has an first opening to expose the pad portion;

the molding compound has a second opening aligned to the first opening of the insulating layer; and the first conductive bump is disposed in the first opening and the second opening, in contact with the pad portion.

17. The semiconductor package assembly as claimed in claim 16, wherein the single circuit structure further comprises:

a via portion connected to the pad portion, having a second width that is less than the first width, wherein the via portion passes through the first solder mask layer and in contact with the first pad, which is close to the die-attach surface.

18. The semiconductor package assembly as claimed in claim 17, wherein the first pad has a third width that is less than the first width and greater than the second width.

19. The semiconductor package assembly as claimed in claim 18, wherein the second pad has a fourth width greater than the third width.

20. The semiconductor package assembly as claimed in claim 17, wherein the insulating layer is formed of a solder mask material or polypropylene (PP).

* * * * *